(12) United States Patent
Kim et al.

(10) Patent No.: US 10,418,250 B2
(45) Date of Patent: Sep. 17, 2019

(54) ETCHING METHOD USING REMOTE PLASMA SOURCE, AND METHOD OF FABRICATING SEMICONDUCTOR DEVICE INCLUDING THE ETCHING METHOD

(71) Applicant: SAMSUNG ELECTRONICS CO., LTD., Suwon-si, Gyeonggi-do (KR)

(72) Inventors: Gon-jun Kim, Suwon-si (KR); Yuri Barsukov, Suwon-si (KR); Vladimir Volynets, Hwaseong-si (KR); Dali Liu, Yongin-si (KR); Sang-jin An, Suwon-si (KR); Beom-jin Yoo, Hwaseong-si (KR); Sang-heon Lee, Seongnam-si (KR); Shamik Patel, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/870,227

(22) Filed: Jan. 12, 2018

(65) Prior Publication Data
US 2018/0374709 A1    Dec. 27, 2018

(30) Foreign Application Priority Data

Jun. 22, 2017  (KR) .................. 10-2017-0079217

(51) Int. Cl.
*H01L 21/3065* (2006.01)
*H01J 37/32* (2006.01)
*H01L 21/02* (2006.01)

(52) U.S. Cl.
CPC .... *H01L 21/3065* (2013.01); *H01J 37/32009* (2013.01); *H01L 21/02164* (2013.01); *H01L 21/02315* (2013.01)

(58) Field of Classification Search
USPC ............................................................ 438/9
See application file for complete search history.

(56) References Cited

U.S. PATENT DOCUMENTS

| | | |
|---|---|---|
| 5,431,772 A | 7/1995 | Babie et al. |
| 5,877,090 A | 3/1999 | Padmapani et al. |
| 6,069,087 A | 5/2000 | Keller et al. |
| 2012/0238102 A1* | 9/2012 | Zhang ............... H01J 37/32422 438/718 |
| 2014/0099794 A1 | 4/2014 | Ingle et al. |
| 2016/0013064 A1 | 1/2016 | Kim et al. |
| 2016/0111298 A1 | 4/2016 | Kim et al. |
| 2016/0247688 A1 | 8/2016 | Zhu et al. |
| 2016/0260619 A1 | 9/2016 | Zhang et al. |

OTHER PUBLICATIONS

Kastenmeier, B.E.E. et al. Remote plasma etching of silicon nitride and silicon dioxide using NF3/O2 gas mixtures. J. Vac. Sci. Technol. A 16, 2047-2056 (1998).

* cited by examiner

*Primary Examiner* — Roberts P Culbert
(74) *Attorney, Agent, or Firm* — Lee & Morse, P.C.

(57) ABSTRACT

An etching method using a remote plasma source (RPS) and a method of fabricating a semiconductor device, the etching method including generating a plasma by supplying a process gas to at least one RPS and applying power to the at least one RPS; and etching a first material film including $SiN_x$ by supplying the plasma and at least one control gas selected from HBr, HCl, HI, $NH_3$, $SiH_4$, $CHF_3$, and $CH_2F_2$ to a process chamber.

17 Claims, 12 Drawing Sheets

ETCHING METHOD USING REMOTE PLASMA SOURCE, AND METHOD OF FABRICATING SEMICONDUCTOR DEVICE INCLUDING THE ETCHING METHOD

CROSS-REFERENCE TO RELATED APPLICATION

Korean Patent Application No. 10-2017-0079217, filed on Jun. 22, 2017, in the Korean Intellectual Property Office, and entitled: "Etching Method Using Remote Plasma Source, and Method of Fabricating Semiconductor Device Including the Etching Method," is incorporated by reference herein in its entirety.

BACKGROUND

1. Field

Embodiments relate to an etching method using a remote plasma source (RPS) and a method of fabricating a semiconductor device.

2. Description of the Related Art

In fabricating semiconductor devices, a series of processes including, e.g., deposition, etching, and cleaning may be performed. Such processes may be performed by using a deposition, etching, or cleaning apparatus having a process chamber. For example, in the case of an etching process, an etching apparatus having a corresponding process chamber may be used. In the etching process, a film to be etched may have a high etch rate, while a film which is not desired to be etched may have a low etch rate. In addition, damage to films in the etching process may be minimized. Meanwhile, an etching process may be performed by a technology using direct plasma, e.g., capacitive coupled plasma (CCP) or inductive coupled plasma (ICP). Here, the direct plasma technique or direct plasma may refer to a technique of directly generating plasma in a process chamber, which is a wafer processing space, or the generated plasma.

SUMMARY

The embodiments may be realized by providing an etching method using a remote plasma source (RPS), the etching method including generating a plasma by supplying a process gas to at least one RPS and applying power to the at least one RPS; and etching a first material film including SiNx by supplying the plasma and at least one control gas selected from HBr, HCl, HI, $NH_3$, $SiH_4$, $CHF_3$, and $CH_2F_2$ to a process chamber.

The embodiments may be realized by providing an etching method using a remote plasma source (RPS), the etching method including generating a first plasma by supplying a first process gas to a first RPS and applying first power thereto; generating a second plasma by supplying a second process gas to a second RPS and applying second power thereto; and etching a first material film including SiNx by supplying the first plasma, the second plasma, and at least one control gas selected from HBr, HCl, HI, $NH_3$, $SiH_4$, $CHF_3$, and $CH_2F_2$ to a process chamber.

The embodiments may be realized by providing a method of fabricating a semiconductor device, the method including generating a plasma by supplying process gases to at least one remote plasma source (RPS) and applying power thereto; etching a first material film containing SiNx and constituting a substrate structure by supplying the plasma and at least one control gas selected from HBr, HCl, HI, $NH_3$, $SiH_4$, $CHF_3$, and $CH_2F_2$ to a process chamber; and performing a subsequent semiconductor process on the substrate structure.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
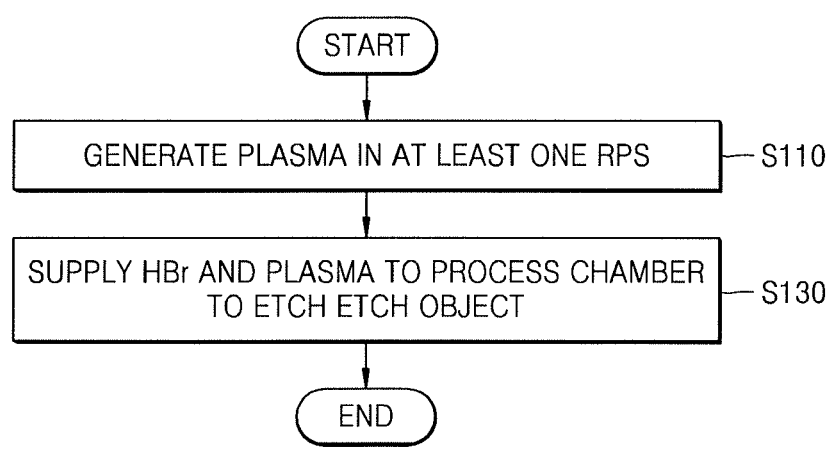
FIG. 1 illustrates a flowchart of an etching method using a remote plasma source (RPS), according to an embodiment.

FIG. 1 illustrates a flowchart of an etching method using a remote plasma source (RPS), according to an embodiment.

Referring to FIG. 1, in the etching method using a remote plasma source (RPS), according to the present embodiment, plasma may be generated in at least one RPS (see 130 in FIG. 2) (S110). Plasma may be generated in the RPS by supplying a process gas and a control gas for the RPS and applying an appropriate amplitude level of power thereto under an appropriate level of pressure and appropriate temperature conditions. In an implementation, there may be one RPS or a plurality of RPSs. When there are a plurality of RPSs, a corresponding process gas may be provided to each of the RPSs and a corresponding level of power may be applied thereto, thereby generating different plasmas in different RPSs. In an implementation, even in the case of one RPS, different plasmas may be generated over time in one RPS by applying the process gas and power differently according to time.

Figure 2:
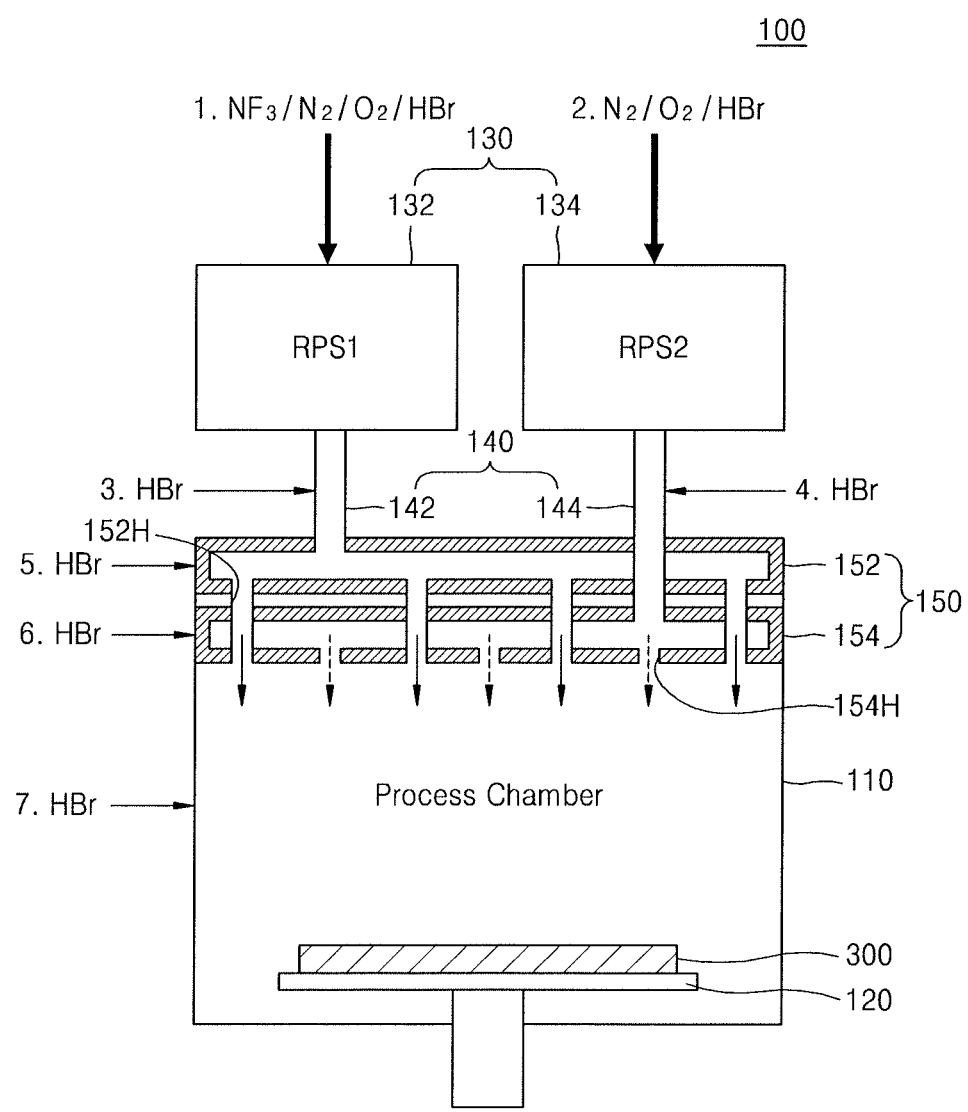
FIG. 2 illustrates a schematic structural view of a semiconductor device manufacturing apparatus including an RPS, which shows the concept of supplying HBr as a control gas to a process chamber in the etching method using the RPS of FIG. 1.

In an implementation, in the etching method using an RPS, according to the present embodiment, at least one RPS may be disposed outside a process chamber (see 110 in FIG. 2). A plasma may be generated by supplying a process gas and applying power to the RPS. In the etching method using the RPS, according to the present embodiment, the process gas may include at least one source gas for etching. In an implementation, the process gas may include a fluorine (F)-based source gas, e.g., $NF_3$, $CF_4$, and the like. In an implementation, the etching method using an RPS, according to the present embodiment, may include a cleaning method using the RPS. Therefore, although only the etching method is described below, the same method, principle, or the like may be applied to the cleaning, and the same effect or the like may be obtained.

The plasma generated in the RPS may be used, e.g., to etch an etch target. In an implementation, the etch target may be a substrate or a material film on the substrate, e.g., a material film containing Si, SiNx, $SiO_2$, or the like. The process conditions for generating the plasma in the RPS may vary depending on the type of process gas. The process conditions may include, e.g., a pressure condition and a temperature condition in the RPS. The power for generating and controlling the plasma in the RPS may be applied in various ways. For example, the applied power may be radio frequency (RF) power in the form of an electromagnetic wave having a predetermined frequency and intensity. Also, with an ON-OFF period in an electromagnetic wave form, the power may be applied in the form of a continuous wave (CW) or in a pulse form.

The plasma generated in the RPS may include a plurality of components. At least one of the components may be mainly used to etch the etch target. For example, the plasma may include a radical, an ion, an electron, an ultraviolet ray, or the like. The radical may etch the etch target isotropically and the ion may etch the etch target anisotropically. This basically occurs as a result of radicals being electrically neutral and ions being electrically polarized. Accordingly, when the etch target is etched to a predetermined thickness, i.e., isotropically etched, radicals may be used. Meanwhile, in this isotropic etching process, ions, electrons, ultraviolet rays, etc. could damage the etch target. Therefore, ions, electrons, ultraviolet rays, and the like may be excluded from the plasma. For example, when the plasma is supplied to a process chamber through a shower head (see 150 in FIG. 2), ions, electrons, ultraviolet rays, and the like may be excluded and only radicals may be supplied to the process chamber.

In an implementation, in the etching method using the RPS, according to the present embodiment, plasmas may be generated by using at least two RPSs. In an implementation, two RPSs including, e.g., a first RPS and a second RPS may be disposed outside the process chamber, wherein a first process gas may be supplied to the first RPS (see 132 in FIG. 2) and first power may be applied thereto under a first process condition to generate a first plasma, and a second process gas may be supplied to the second RPS (see 134 in FIG. 2) and second power may be applied thereto under a second process condition to generate a second plasma. The first plasma and the second plasma may each include a plurality of components, and for each plasma, at least one of the components may be used to etch the etch target. The first and second process gases, and the first and second process conditions will be described in more detail in connection with FIG. 2, and the first and second power application methods will be described in more detail in connection with FIGS. 3A and 3B.

After the generation of a plasma, the plasma generated in the RPS and hydrogen bromide (HBr) may be supplied into a process chamber to etch an etch target (S130). HBr may be supplied to the process chamber through various paths. The supply of HBr through the various paths will be described in more detail in connection with FIG. 2.

HBr may be supplied as a kind of control gas to the process chamber together with the plasma, thereby significantly improving the etching efficiency with respect to the etch target. For example, the etch rate of the etch target may be increased and the selectivity or etch selectivity of the etch target may be increased. In an implementation, the etch rate may be defined as the etched thickness of the etch target per minute, and the selectivity may be defined as the (etch rate of an etch target/etch rate of a non-etch target). In the etching method using the RPS, according to the present embodiment, e.g., the etch target may be a first material film including SiNx, and the non-etch target may be a second material film including $SiO_2$. In an implementation, in the etching method using the RPS, according to the present embodiment, the selectivity of the first material film with respect to the second material film, e.g., the (etch rate of the first material film/etch rate of the second material film) may be, e.g., 500 or more, and the etch rate of the first material film may be 200 Å/min or more. Hereinafter, "the selectivity of the first material film with respect to the second material film" is abbreviated simply as "selectivity". However, in some cases, the selectivity may be interpreted as the 'selectivity of the etch target with respect to the non-etch target'.

The principle and efficiency of supplying the control gas HBr together with the plasma to the process chamber to etch the etch target with a high selectivity at a high etch rate will be described in more detail in connection with FIGS. 4 to 7B.

The etching method using the RPS, according to the present embodiment, may increase the etch rate of the etch target and may remarkably increase the selectivity thereof by generating a plasma in at least one RPS and supplying the control gas HBr with the plasma to the process chamber to etch the etch target. In general, a dry etch method using plasma may not have a higher etch rate and selectivity than when a wet etch method is used. In the etching method using the RPS, according to the present embodiment, the etch rate and selectivity of the etch target may be remarkably increased by using HBr as a control gas. For example, when the etch target is a first material film including SiNx and the non-etch target is a second material film including $SiO_2$, the etching method using the RPS, according to the present embodiment, may include supplying the control gas HBr with the plasma, and the first material film may be etched at a high etch rate of 200 Å/min or more and with a high selectivity of 500 or more.

FIG. 2 illustrates a schematic structural view of a semiconductor device fabrication apparatus 100 including an RPS, which shows the concept of supplying HBr as a control gas to a process chamber in the etching method using the RPS of FIG. 1.

Referring to FIG. 2, the etching method using the RPS, according to the present embodiment, may be performed by using the semiconductor device fabrication apparatus 100 having two RPSs.

The semiconductor device fabrication apparatus 100 may include a process chamber 110, a stage 120, an RPS unit 130, and a shower head unit 150. The semiconductor device fabrication apparatus 100 may be an apparatus for performing deposition, etching, cleaning, and the like in a process of fabricating a semiconductor device. Accordingly, the process chamber 110 may be a chamber used in a deposition process, an etching process, a cleaning process, or the like in a process of fabricating a semiconductor device. In the etching method using the RPS, according to the present embodiment, the semiconductor device fabrication apparatus 100 may be an apparatus for performing the etching process, and the process chamber 110 may be a chamber for performing the etching process. For example, the process chamber 110 may be a plasma etch chamber in which an etch target is etched by using plasma.

Here, the etch target may be a substrate or a material film on the substrate. The substrate may be a semiconductor substrate including a semiconductor material. The material film on the substrate may be an insulating film and/or a conductive film formed on the substrate by using various methods including vapor deposition, coating, and plating. For example, the insulating film may include an oxide film, a nitride film, or an oxynitride film, and the conductive film may include a metal film, a polysilicon film, or the like. The material film may be a single film or a multiple film on an entire surface of the substrate. In an implementation, the material film may be formed in a certain pattern on the substrate. In the etching method using the RPS, according to the present embodiment, the etch target may be a material film on a substrate, for example, a material film containing SiN on a substrate. Accordingly, a substrate structure 300 disposed on the stage 120 illustrated in FIG. 2 may include a substrate and a material film on the substrate.

The stage 120 may be disposed in a lower portion of the inside of the process chamber 110. The substrate structure 300 including an etch target may be placed on a top surface of the stage 120. The stage 120 may support the substrate structure 300 during the etching process. In an implementation, the stage 120 may function as an electrode during the etching process. For example, when a bias is applied during the etching process, the stage 120 may function as an electrode.

The RPS unit 130 may include a first RPS 132 and a second RPS 134. The first RPS 132 and the second RPS 134 may be spaced apart from the process chamber 110 and located outside the process chamber 110. The first RPS 132 and the second RPS 134 may be separate plasma chambers that produce plasma independently from the etching process. Referring to FIG. 2, the RPS unit 130 may include the two RPSs. In an implementation, the RPS unit 130 may include three or more RPSs. In an implementation, the RPS unit 130 may include only one RPS. For reference, when the RPS unit 130 includes one RPS, the RPS unit 130 may generate one kind of plasma or two or more kinds of plasma. The generation of two or more kinds of plasma may be realized by applying process gases, process conditions, and power differently for each time section.

A first plasma may be generated by supplying a first process gas to the first RPS 132 and applying first power thereto under a first process condition. In an implementation, the first process gas may include at least one source gas for etching. In an implementation, the first process gas may include a fluorine (F)-based source gas, e.g., $NF_3$, $CF_4$, or the like. The first process gas may further include, in addition to the fluorine (F)-based source gas, another process gas, e.g., $N_2$, $O_2$, $N_2O$, NO, Ar, He, $H_2$, or the like. In an implementation, in the etching method using the RPS, according to the present embodiment, the first process gas may include, e.g., $NF_3$, $N_2$, $O_2$, or the like.

The first process condition may include a pressure condition, a temperature condition, and/or the like, and may be changed depending on the kind of the first process gas. In the case of the first power, the first power may be applied in the form of a first electromagnetic wave having a first frequency and a first intensity, and may be applied with a first ON-OFF period in a continuous wave form, or in a pulse form. The first plasma may include a plurality of components. At least one of the components may be used to etch an etch target included in the substrate structure 300. For example, the first plasma may include a first radical, a first ion, an electron, an ultraviolet ray, or the like. The first radical may isotropically etch the etch target of the substrate structure 300 and the first ion may anisotropically etch the etch target of the substrate structure 300. Accordingly, when the etch target included in the substrate structure 300 is isotropically etched, the first ion, the electron, the ultraviolet ray, etc. may be removed through the shower head unit 150 and only the first radical may be supplied to the process chamber 110.

A second plasma may be generated by supplying a second process gas to the second RPS 134 and applying second power thereto under a second process condition. The second process gas may include at least one source gas for etching. In an implementation, the second process gas may be different from the first process gas. In an implementation, the first process gas may be the same as the second process gas. In an implementation, the second process gas may be oxygen (O)-based gas, e.g., $O_2$, $N_2O$, or NO. In an implementation, the second process gas may further include, in addition to the oxygen-based gas, other process gases. In an implementation, the second process gas may further include, e.g., $N_2$, Ar, He, $H_2$, or the like, or may include a fluorine (F)-based gas, e.g., $NF_3$. In an implementation, in the etching method using the RPS, according to the present embodiment, the second process gas may include, e.g., $N_2$, $O_2$, or the like.

The second process condition may be changed depending on the kind of the second process gas, and may include a pressure condition, a temperature condition, or the like. In the case of the second power, the second power may be applied in the form of a second electromagnetic wave having a second frequency and a second intensity, and may be applied with a second ON-OFF period in a continuous wave form, or in a pulse form. The second electromagnetic wave may be the same as or different from the first electromagnetic wave. For example, the second electromagnetic wave may have the same frequency and ON-OFF period as the first electromagnetic wave, and the intensity of the second electromagnetic wave may be different from that of the first electromagnetic wave.

The second plasma may include a plurality of components. At least one of the components may be used to etch an etch target included in the substrate structure 300. For example, the second plasma may include a second radical, a second ion, an electron, an ultraviolet ray, etc., and the second radical may isotropically etch the etch target included in the substrate structure 300. The second ion may anisotropically etch the etch target of the substrate structure 300. Accordingly, similar to the case applied to the first plasma, when the etch target of the substrate structure 300 is isotropically etched, the second ion, the electron, the ultraviolet ray, etc. are removed from the shower head unit 150 and only the second radical is removed through the process chamber 110.

The shower head unit 150 may include a first shower head 152 and a second shower head 154. In an implementation, the first shower head 152 and the second shower head 154 may be spaced apart from each other. In an implementation, the shower head unit 150 may be integrally formed, and the integral structure may be divided into two separate spaces respectively functioning as a first shower head and a second shower head.

The first shower head 152 may be disposed in an upper portion of the inside of the process chamber 110. The first shower head 152 may be connected to the first RPS 132 through a first supply passage 142 constituting a plasma supply passage 140 and may receive the first plasma generated in the first RPS 132. Accordingly, the first shower head 152 may supply the first plasma generated in the first RPS 132 to the process chamber 110. For example, the first shower head 152 may, through a plurality of first holes 152H, spray the first plasma onto the substrate structure 300 located on the stage 120 in the process chamber 110. The plurality of first holes 152H formed in the first shower head 152 may be passages connecting an inner space of the first shower head 152 to the process chamber 110. The first holes 152H may extend from a lower surface of the first shower head 152, and may be connected to the inside of the process chamber 110 through the second shower head 154. For example, the first holes 152H may each have a pipe structure passing through the second shower head 154.

A size of each of the first holes 152H may be such that they allow only the first radical of the first plasma to pass therethrough, and not the first ion, the electron, and the like. Here, the size of each of the first holes 152H may be determined based on the Debye length concept. A ground may be connected to the first holes 152H. Accordingly, when the first plasma flows through the first holes 152H, only the first radical may be supplied to the process chamber 110 through the first holes 152H. The first ion, the electron, and the like may not pass through the first holes 152H, and the first ion, the electron, and the like may not be supplied to the process chamber 110. Accordingly, in the etching process, the substrate structure 300 may be prevented from being damaged by the first ion, the electron, and the like. The size of each of the first holes 152H may be changed according to the kind of the first process gas. The first radical may be sprayed to the process chamber 110 through the first holes 152H, and the first holes 152H may correspond to spray holes of the first shower head 152.

The second shower head 154 may also be disposed in an upper portion of the inside of the process chamber 110. In one embodiment, the second shower head 154 may be disposed under the first shower head 152 as illustrated in FIG. 2. The second shower head 154 may be connected to the second RPS 134 through a second supply passage 144 constituting the plasma supply passage 140 and may receive the second plasma generated in the second RPS 134. In an implementation, the second supply passage 144 may be connected to the second shower head 154 through the first shower head 152. Accordingly, the second shower head 154 may supply the second plasma generated in the second RPS 134 to the process chamber 110. In an implementation, the second shower head 154 may spray, through a plurality of second holes 154H, the second plasma generated in the second RPS 134 onto the substrate structure 300 located on the stage 120 in the process chamber 110.

A size of each of the second holes 154H formed in the second shower head 154 may be such that they allow only the second radical to pass therethrough, and not the second ion, the electron, and the like. The size of each of the second holes 154H may be determined based on the Debye length concept, and the ground may be connected to the second holes 154H. Accordingly, when the second plasma flows through the second holes 154H, only the second radical may be supplied to the process chamber 110 through the second holes 154H. The second ion, the electron, and the like may not pass through the second holes 154H, and the second ion, the electron, and the like may not be supplied to the process chamber 110. Accordingly, in the etching process, the substrate structure 300 may be prevented from being damaged by the second ion, the electron, and the like. The size of each of the second holes 154H may also be changed according to the type of the second process gas. The second radical is sprayed to the process chamber 110 through the second holes 154H, and the second holes 154H may correspond to spray holes of the second shower head 154.

In an implementation, the second shower head 154 may have a plurality of through holes through which the first holes 152H each having the pipe structure may pass. The space for the first holes 152H may be isolated from the inner space of the second shower head 154. Accordingly, the first radical may be sprayed onto the substrate structure 300 in the process chamber 110 directly through the first holes 152H without mixing with the second radical in the second shower head 154. The second radical may be sprayed onto the substrate structure 300 within the process chamber 110 through the second holes 154H. As described above, the first radical and the second radical may not be mixed in advance and may be separately supplied to the process chamber 110 through separate paths, and the amounts and types of the first radical and the second radical may be independently controlled. Accordingly, the etching process performed on the etch target of the substrate structure 300 may be precisely controlled.

In the etching method using the RPS, according to the present embodiment, HBr may be supplied as a control gas to the process chamber 110 through various paths. For example, as a first path, as indicated by '1. $NF_3/O_2/N_2/HBr$', HBr may be supplied to the first RPS 132 together with $NF_3$, $N_2$, and $O_2$, which may each be included in the first process gas. As a second path, as indicated by '2. $O_2/N_2/HBr$', HBr may be supplied to the second RPS 134 together with $N_2$, $O_2$, etc., which may each be included in the second process gas. As a third path, as indicated by '3. HBr'. HBr may be supplied to the first supply passage 142 together with the first plasma generated in the first RPS 132. As a fourth path, as indicated by '4. HBr', HBr may be supplied to the second supply passage 144 together with the second plasma generated in the second RPS 134. As a fifth path, as indicated by '5. HBr', HBr may be supplied to the first shower head 152 together with the first plasma generated in the first RPS 132. As a sixth path, as indicated by '6. HBr', HBr may be supplied to the second shower head 154 together with the second plasma generated in the second RPS 134. Finally, as a seventh path, as indicated by '7. HBr', HBr may be directly supplied to the process chamber 110 through an inlet directly connected to the process chamber 110.

In the etching method using the RPS, according to the present embodiment, HBr may be supplied to the process chamber 110 through at least one of the seven paths described above.

In the etching method using the RPS, according to the present embodiment, plasma may be independently generated by using two RPSs spaced apart from the process chamber 110 and then supplied to the process chamber 110. Thereby, the amount and kind of plasma may be independently and precisely controlled, and accordingly, the etching of the etch target of the substrate structure 300, e.g., the etching of a material film on a substrate may be controlled uniformly and precisely. In addition, in the etching method using the RPS, according to the present embodiment, plasmas may be respectively generated in the two RPSs and each plasma may be independently supplied to the process chamber 110; further, HBr may be supplied to the process chamber 110 through various paths to remarkably increase etch efficiencies with respect to the etch target. e.g., the etch rate and the selectivity of the etch target.

Figure 3A:
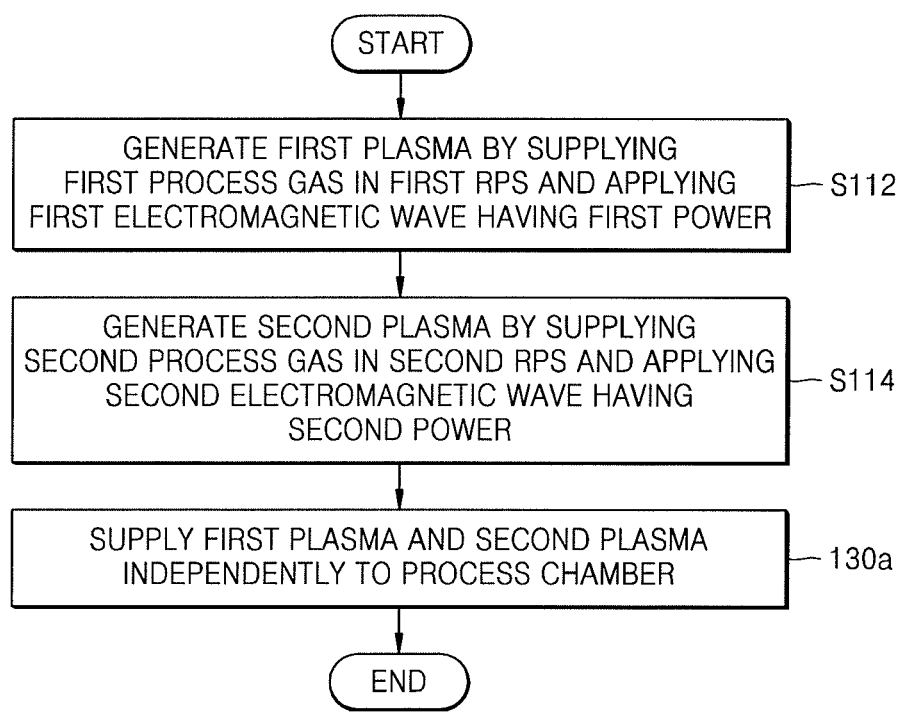
FIG. 3A illustrates a flowchart of a method of generating and supplying plasma in the semiconductor device manufacturing apparatus of FIG. 2.
Figure 3B:
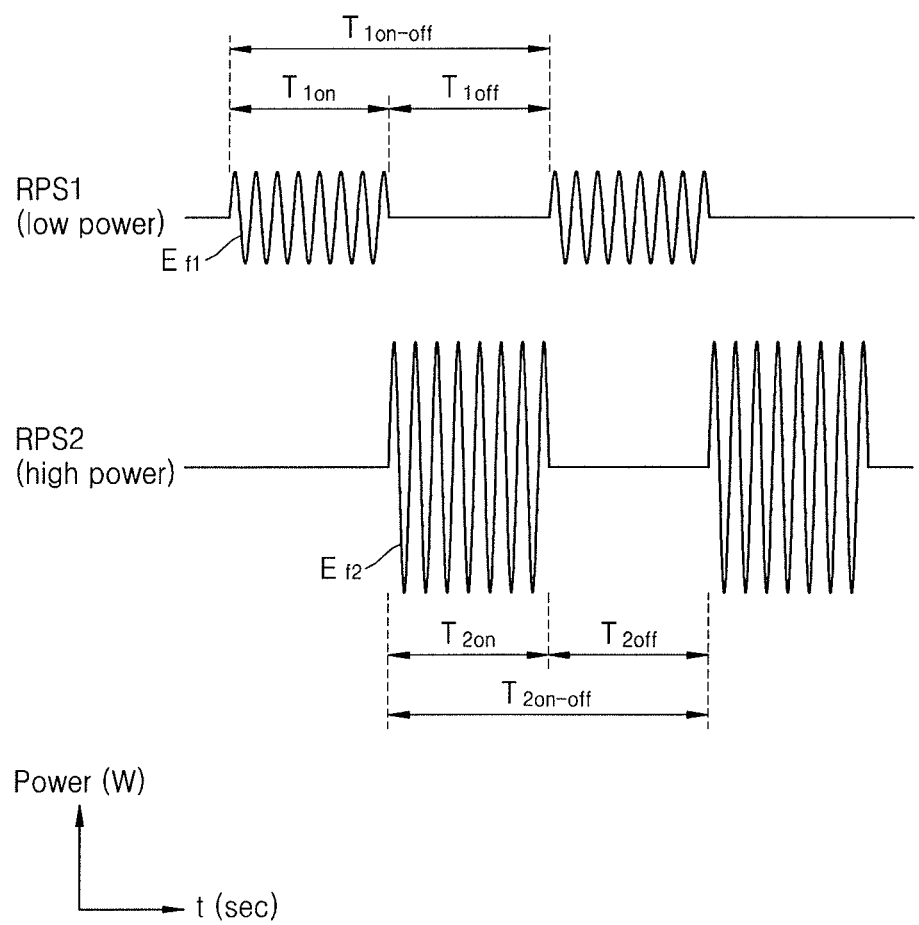
FIG. 3B illustrates a waveform diagram of electromagnetic waves for radio frequency (RF) power corresponding to the method.

FIG. 3A illustrates a flowchart showing a method of generating and supplying plasma in the semiconductor device fabrication apparatus 100 of FIG. 2, and FIG. 3B shows a waveform diagram of electromagnetic waves for RF power corresponding thereto. For ease of understanding, the description thereof will be provided together with FIG. 2.

Referring to FIGS. 3A and 3B, in the etching method using the RPS, according to the present embodiment, a method of generating plasma and a method of supplying plasma will be described below. First, the first process gas may be supplied to the first RPS 132 and a first electromagnetic wave Ef1 having first power may be applied thereto at a first duty ratio, thereby generating the first plasma (S112). In an implementation, the first process gas may include, e.g., a fluorine (F)-based gas. In an implementation, the first power may be a low power of less than a few hundred watts. Here, the duty ratio may be defined as a percentage of the ON period with respect to the period when the electromagnetic wave is periodically applied while being turned on and off. For example, when a power ON-period T1on of a first electromagnetic wave Ef1 is 10 seconds and a power OFF-period T1off of the first electromagnetic wave Ef1 is 10 seconds, an ON-OFF period T1ON-OFF may be 20 seconds and a first duty ratio, that is, T1on/T1on–off*100(%) may be 50%. Meanwhile, when the duty ratio is 100%, it may mean that electromagnetic waves are continuously applied without a power-OFF period. Accordingly, the first power may be applied to the first RPS 132 in the form of the first electromagnetic wave Ef1 in various ways according to the first duty ratio.

Next, the second process gas may be supplied to the second RPS 134, and a second electromagnetic wave Ef2 having the second power may be applied thereto at the second duty ratio to generate the second plasma (S114). In an implementation, the second process gas may include an oxygen (O)-based gas. In an implementation, the first power may be a high power of a few hundred watts or more. The second duty ratio may be calculated as follows: T2on/T2on–off*100(%). The second duty ratio may be identical to or different from the first duty ratio. In an implementation, the second duty ratio of the second electromagnetic wave Ef2 may be identical to the first duty ratio of first electromagnetic wave Ef1. However, the power ON-period T2on of the second electromagnetic wave Ef2 and the power ON-period T1on of the first electromagnetic wave Ef1 are configured to have a staggered arrangement with respect to each other.

In an implementation, in the plasma generating method according to the present embodiment, the first plasma may be generated and then the second plasma may be generated. In an implementation, the second plasma may first be generated and then the first plasma may be generated. In an implementation, the first plasma and the second plasma may be simultaneously generated.

In an implementation, the first electromagnetic wave Ef1 and the second electromagnetic wave Ef2 may be applied in the form of a continuous wave (CW) as illustrated in the related drawing. In an implementation, the first electromagnetic wave Ef1 and the second electromagnetic wave Ef2 may be applied in a pulse form, or may be applied in a combined form of a CW form and a pulse form. Here, the pulse form may be a form in which the electromagnetic wave is repeatedly turned on and off at a pulse frequency in the ON-period. For example, when the frequency of the electromagnetic wave is 100 MHz and the pulse frequency is 500 kHz, an electromagnetic wave corresponding to 100 periods obtained by dividing 100M by 500 k may be included in one pulse period.

Then, the generated first plasma and the generated second plasma may be independently supplied to the process chamber 110 (S130a). For example, the first plasma may be supplied to the process chamber 110 through the first shower head 152, and the second plasma may be supplied to the process chamber 110 through the second shower head 154. Here, the supplying of the first plasma and the second plasma to the process chamber 110 may correspond to etching of the etch target of the substrate structure 300 located on the stage 120. In an implementation, the control gas HBr may be supplied to the process chamber 110 together with the first plasma and the second plasma. HBr may be supplied to the process chamber 110 through various paths as described in connection with FIG. 2.

In an implementation, the first plasma and the second plasma may be sequentially supplied to the process chamber 110. For example, the first plasma may be supplied and then the second plasma may be supplied. In an implementation, the supply order may be changed. In an implementation, the first plasma and the second plasma may be simultaneously supplied. In an implementation, the supply of the first plasma may not mean supplying the entirety of the first plasma but supplying the radical contained in the first plasma. For example, ions, electrons, etc. of the first plasma may be blocked when the first plasma passes through the first holes 152H, and only the first radical may be supplied to the process chamber 110. The supply of the second plasma may also be interpreted in the same sense.

Figure 4:
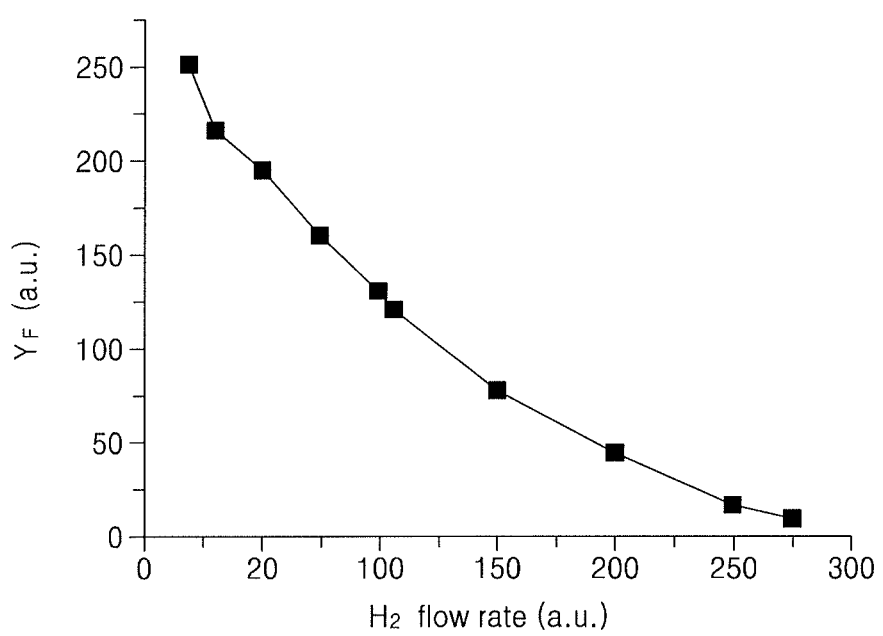
FIG. 4 illustrates a graph showing the function of the control gas in the etching method using the RPS illustrated in FIG. 1.

FIG. 4 illustrates a graph showing the function of the control gas in the etching method using the RPS explained in connection with FIG. 1, in which the x-axis represents the flow rate of hydrogen ($H_2$) as a control gas, and the unit thereof is an arbitrary unit (a.u.), and in which the y-axis represents the yield or concentration of a fluorine (F) radical, and the unit thereof is also an arbitrary unit (a.u.).

Referring to FIG. 4, plasma generated by applying power to $NF_3$, which is a process gas, may include radicals of F, NF, and $NF_2$. Here, the radicals of NF and $NF_2$ may act only on the etching of the first material film containing SiNx. However, the F radical may act not only on the etching of the first material film but also on the etching of the second material film including $SiO_2$. To obtain a high etch rate for the first material film, a large amount of the F radical needs to be produced. However, to increase the selectivity of the first material film, an amount of the F radical must be reduced. In this situation, when $H_2$ is supplied as a control gas, the F radical, which is the main etchant of the second material film, may be removed by the reaction of H+F→HF.

As shown in the graph of FIG. 4, it may be seen that as the flow rate of the $H_2$ increases, the amount of the F radical gradually decreases. As a result, by supplying $H_2$ at a suitable flow rate, the first material layer may be etched with a high selectivity and at a high etch rate. Therefore, in the etching method using the RPS, according to the present embodiment, the control gas $H_2$ performs its main function of controlling the concentration of the F radical, and the concentration of the F radical may be expressed as a function of the flow rate of $H_2$. Meanwhile, it may be seen that these experimental results are substantially similar to the results of a plasma chemistry simulation. Here, the plasma chemistry simulation is a simulation program for calculating the concentration of radicals in the plasma by inputting the process gas and the control gas as input parameters.

Figure 5A:
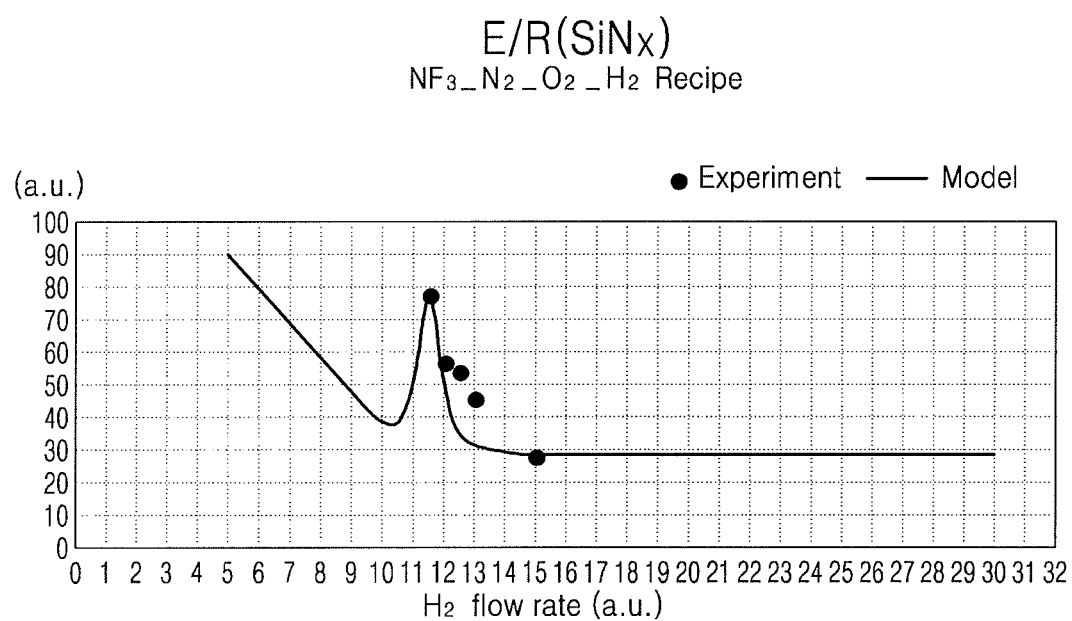
FIG. 5A illustrates a graph showing etch rates of a first material film including SiNx when $H_2$ is used as a control gas in the etching method using the RPS illustrated in FIG. 1.
Figure 5B:
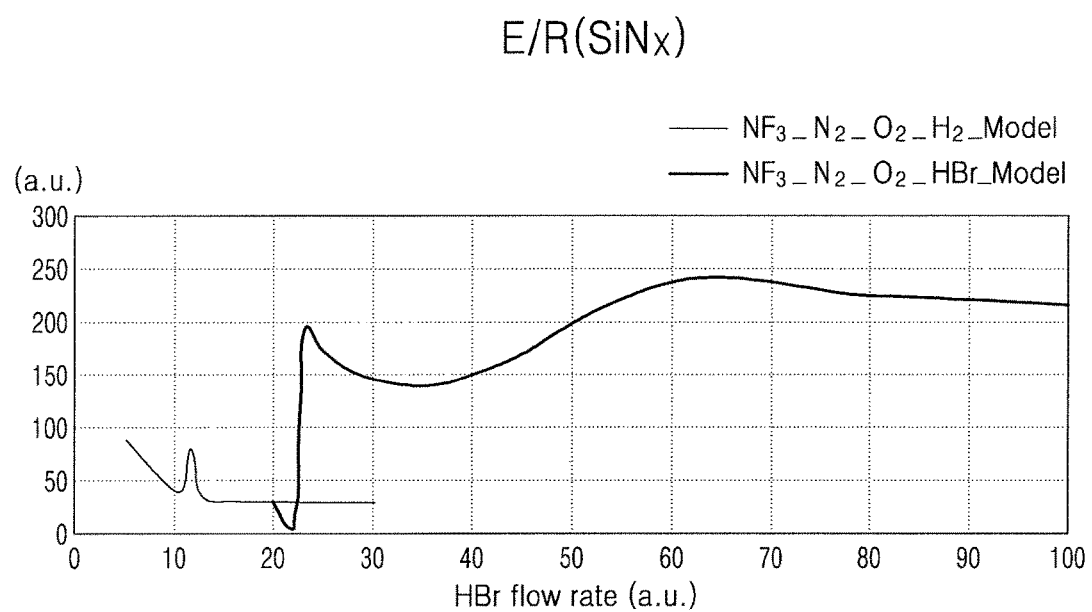
FIG. 5B illustrates a graph showing etch rates of a first material film including SiNx when HBr is used as a control gas in the etching method using the RPS illustrated in FIG. 1.

FIG. 5A illustrates a graph showing etch rates of the first material film including SiNx when $H_2$ is used as a control gas in the etching method using the RPS illustrated in FIG. 1, and FIG. 5B illustrates a graph showing etch rates of the first material film including SiNx when HBr is used as a control gas in the etching method using the RPS illustrated in FIG. 1. FIG. 5A includes a graph of the experimental result and a model, and FIG. 5B includes a graph of the model. Here, the x-axis represents the flow rate of a corresponding control gas, and the unit thereof is an arbitrary unit (a.u.); and the y-axis represents the etch rate of the first material film, and the unit thereof is also an arbitrary unit (a.u.).

Referring to FIG. 5A, it may be seen from the graph that the experimental result (•) and the model (-) are somewhat consistent with each other with respect to the etch rate of the first material film according to the flow rate of $H_2$ as a control gas. Here, $NF_3$, $N_2$, $O_2$, and $H_2$ are used as process gases. These process gases are included in a process recipe under process conditions, and may have a fixed flow rate based on the conditions of a recipe set table. For example, in a first experiment, process gases have fixed flow rates according to a first condition of a recipe set table, and in a second experiment, the process gases may have fixed flow rates according to a second condition of the recipe set table. $H_2$ is a control gas of which a flow rate is changed, and as illustrated in the related drawing, the etch rate may be measured or calculated according to the flow rate of $H_2$. For reference, the experimental result indicates the etch rate of the first material film obtained through experiments, and the model indicates the etch rate of the first material film calculated through a quantum chemistry simulation. Here, the quantum chemistry simulation is a simulation program for calculating the etch rate of the first material film based on a bonding energy of the first material film, which is the etch target, with the concentration of the radicals obtained through the plasma chemical simulation as an input parameter.

The match of the experimental result with the model obtained by the quantum chemistry simulation demonstrates the effectiveness of the quantum chemistry simulation with respect to the etching of the first material film, and also demonstrates the effectiveness of the reaction mechanism with respect to the etching of the first material film used in the quantum chemistry simulation.

FIG. 5B shows a graph of a model (-) for the etch rate of the first material film, which is calculated through the quantum chemistry simulation using $NF_3$, $N_2$, $O_2$, and HBr as a process gas according to a process recipe and HBr as a control gas. As described in connection with FIG. 5A, since the experimental result matches the model with respect to the etch rate of the first material film when $H_2$ is used as a control gas, it can be expected that the experimental result will match the model in terms of the etch rate of the first material film when HBr is used as a control gas.

To compare the case of using HBr as a control gas and the case of using $H_2$ as a control gas, the model (-) for the etch rate of the first material film when $H_2$ is used as a control gas is shown on the left. As can be seen from FIGS. 5A and 5B, it may be seen that the etch rate of the first material layer is greatly increased when HBr is used as a control gas. For example, when their maximum values are compared, it may be seen that the etch rate of the first material film is increased by almost two times or more.

Meanwhile, in the case of using HBr as a control gas, it may be seen that the etch rate of the first material film rapidly increased when the flow rate of HBr was about 20 or more. Considering that the flow rate of $NF_3$ applied to this model is about 20, when the HBr is used as a control gas, the etch rate of the first material layer may be greatly increased by supplying the HBr at a flow rate at which the following Equation 1 is satisfied:

$$[NF_3]/[HBr] \leq 1 \qquad \text{Equation 1.}$$

In Equation 1, $[NF_3]$ and $[HBr]$ represent the flow rates of $NF_3$ and HBr, respectively.

In the case of using $H_2$ as a control gas, the etch rate of the first material layer may be relatively high in a very narrow region around a flow rate of about 12, but at flow rates of less than 10 and more than 12, the etch rate of the first material layer may be low. On the other hand, when HBr is used as a control gas, it may be seen that the etch rate of the first material film is high at flow rates of about 20 or more.

This result means that, when $H_2$ is used as a control gas, there is a very narrow window in which the etching process of the first material film may be performed. For example, in the etching process of the first material film, the flow rate of $H_2$ may be controlled within a very narrow range to increase the etch rate of the first material film. On the other hand, when HBr is used as a control gas, a window in which the etching process of the first material film may be performed may be relatively wide. For example, in the etching process of the first material film, the flow rate of HBr may be controlled within a relatively wide range to increase the etch rate of the first material film.

Figure 6A:
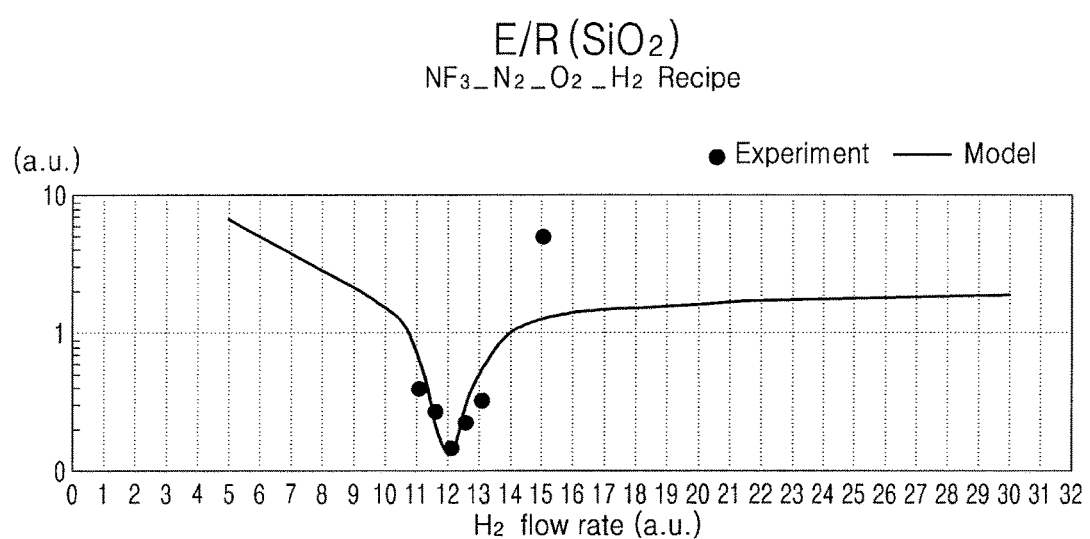
FIG. 6A illustrates a graph showing etch rates of a second material film including $SiO_2$ when $H_2$ is used as a control gas in the etching method using the RPS illustrated in FIG. 1.
Figure 6B:
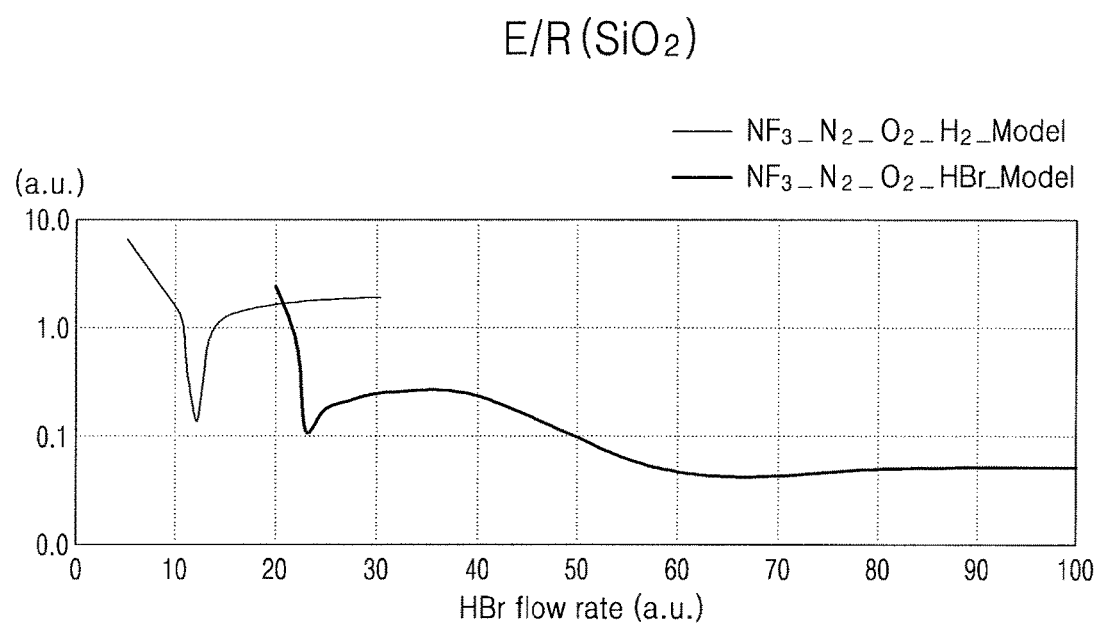
FIG. 6B illustrates a graph showing etch rates of a second material film including $SiO_2$ when HBr is used as a control gas in the etching method using the RPS illustrated in FIG. 1.

FIG. 6A illustrates a graph showing etch rates of the second material film including $SiO_2$ when $H_2$ is used as a control gas in the etching method using the RPS illustrated in FIG. 1, and FIG. 6B illustrates a graph showing etch rates of the second material film including $SiO_2$ when HBr is used as a control gas in the etching method using the RPS illustrated in FIG. 1. FIG. 6A includes a graph of the experimental result and a model, and FIG. 6B includes a graph of the model. The variables and units of the x-axis and y-axis are the same as described in connection with FIGS. 5A and 5B. However, the y-axis is expressed on a log scale.

Referring to FIG. 6A, it may be seen from the graph that the experimental result (•) and the model (-) are somewhat consistent with each other with respect to the etch rate of the second material film according to the flow rate of $H_2$ as a control gas. Herein, process gases $NF_3$, $N_2$, $O_2$, and $H_2$ may be used as a process recipe. The match of the experimental result with the model obtained by the quantum chemistry simulation demonstrates the effectiveness of the quantum chemistry simulation with respect to the etching of the second material film and also demonstrates the effectiveness of the reaction mechanism with respect to the etching of the second material film used in the quantum chemistry simulation.

FIG. 6B shows a graph of a model (-) for the etch rate of the second material film, which is calculated through the quantum chemistry simulation using $NF_3$, $N_2$, $O_2$, and HBr as a process gas according to a process recipe and HBr as a control gas. As described in connection with FIG. 6A, the experimental result matches the model with respect to the etch rate of the second material film when $H_2$ is used as a control gas, and it can be expected that the experimental result would match the model with respect to the etch rate of the second material film when HBr is used as a control gas.

To compare the case of using HBr as a control gas and the case of using $H_2$ as a control gas, the model (-) for the etch rate of the second material film when $H_2$ is used as a control gas is shown on the left. As shown in FIGS. 6A and 6B, it may be seen that the etch rate of the second material layer is low when HBr is used as a control gas.

Meanwhile, in the case of using HBr as a control gas, it can be confirmed that the etch rate of the second material film is low when the flow rate of HBr is about 20 or more. Considering that the flow rate of $NF_3$ applied to this model is about 20, when the HBr is used as a control gas, the etch rate of the second material layer may be reduced by supplying the HBr at a flow rate at which Equation 1 is satisfied.

In the case of using $H_2$ as a control gas, the etch rate of the second material layer may be low in a very narrow region around a flow rate of about 12, but at flow rates of less than 10 and more than 12, the etch rate of the second material layer may be high. On the other hand, when HBr is used as a control gas, it can be seen that the etch rate of the second material film may be low at flow rates of about 20 or more. These results show that like in the etching process of the first material film, even in the etching process of the second material film, when $H_2$ is used as a control gas, a window in which the process may be performed is very narrow, and when HBr is used as a control gas, the window is wide.

Figure 7A:
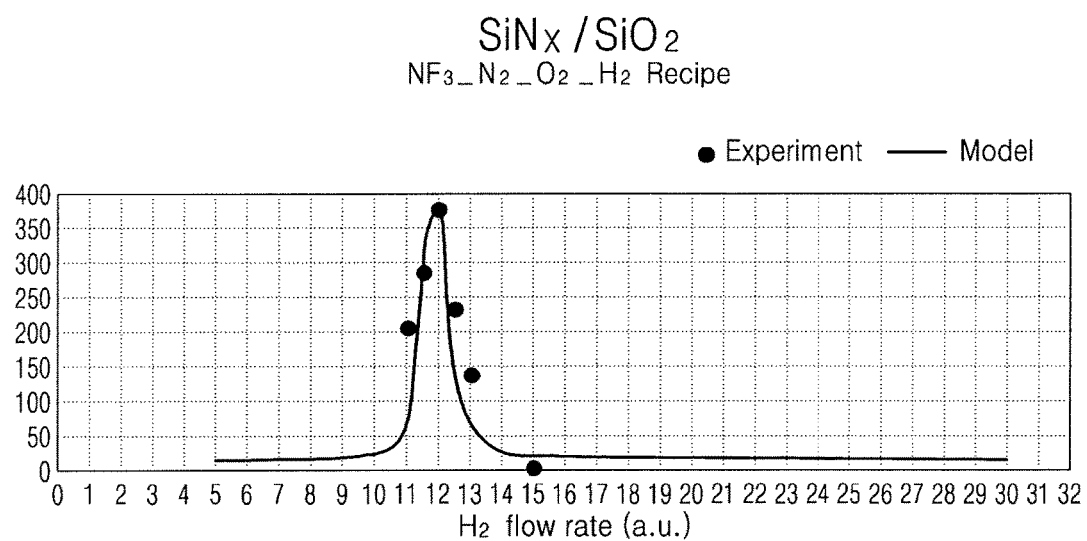
FIG. 7A illustrates a graph showing selectivity of the first material film with respect to the second material film when $H_2$ is used as a control gas in the etching method using the RPS illustrated in FIG. 1.
Figure 7B:
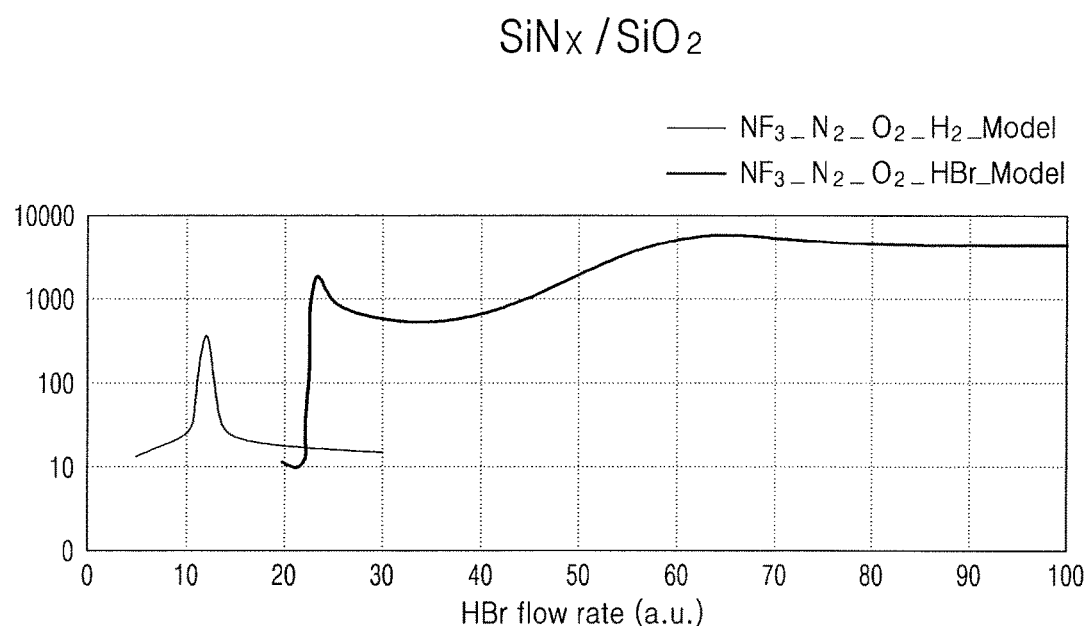
FIG. 7B illustrates a graph showing selectivity of the first material film with respect to the second material film when HBr is used as a control gas in the etching method using the RPS illustrated in FIG. 1.

FIG. 7A illustrates a graph of selectivity when $H_2$ is used as a control gas in the etching method using the RPS illustrated in FIG. 1, and FIG. 7B illustrates a graph of selectivity when HBr is used as a control gas in the etching method using the RPS illustrated in FIG. 1. FIG. 7A includes a graph of the experimental result and a model, and FIG. 7B includes a graph of the model. The variables and units of the x-axis and y-axis are the same as described in connection with FIGS. 5A and 5B. However, the y-axis of FIG. 7B is expressed on a log scale.

Referring to FIG. 7A, it may be seen from the graph that the experimental result (•) and the model (-) are somewhat consistent with each other with respect to the selectivity according to the flow rate of $H_2$ as a control gas, e.g., 'the etch rate of the first material film/the etch rate of the second material film.' For reference, the experimental result (•) and the model (-) of the selectivity may be automatically calculated using the results of FIG. 5A and FIG. 6A, instead of performing a new experiment or simulation. For example, for each $H_2$ flow rate, the selectivity may be calculated by dividing the 'etch rate of the first material film' by the 'etch rate of the second material film'.

FIG. 7B shows a graph of the selectivity according to the flow rate of HBr as a control gas when $NF_3$, $N_2$, $O_2$, and HBr are each used as a process gas, and HBr is used as a control gas. As described in connection with FIG. 7A, the experimental result matches the model with respect to the selectivity when $H_2$ is used as a control gas, and it can be expected that the experimental result will match the model with respect to the selectivity when HBr is used as a control gas. Here, the model (-) of the selectivity may be automatically calculated using the results of FIGS. 5B and 6B, instead of performing a new simulation.

To compare the case of using HBr as a control gas and the case of using $H_2$ as a control gas, the model (-) for the selectivity when $H_2$ is used as a control gas is shown on the left. As can be seen from FIGS. 7A and 7B, it can be seen that the selectivity is remarkably high when HBr is used as a control gas. For example, when $H_2$ is used as a control gas, the maximum value of the selectivity may be about 400, whereas when the HBr is used as a control gas, the maximum value of the selectivity may be 5,000 or more.

Meanwhile, in the case of using HBr as a control gas, it may be seen that the selectivity is high when the flow rate of HBr is about 20 or more. Considering that the flow rate of $NF_3$ applied to this model is about 20, when HBr is used as a control gas, a high selectivity of, e.g., 500 or more may be obtained by supplying the HBr at a flow rate at which Equation 1 is satisfied.

Meanwhile, when $H_2$ is used as a control gas, the selectivity may be relatively high in a very narrow range of flow rates of about 12, and at other flow rates, the selectivity may be low. On the other hand, when HBr is used as a control gas, it may be be seen that the selectivity may be high at flow rates of about 20 or more. These results show that, in an etching process on a substrate structure including the first material film and the second material film, when $H_2$ is used as a control gas, a process for etching the first material layer may be performed within a narrow window, whereas when HBr is used as a control gas, a process for performing selective etching of the first material film may be performed within a wide window.

Hereinbefore, HBr has been described as an example of the control gas. In an implementation, in the etching method using the RPS, according to the present embodiment, any one of HCl, HI, $NH_3$, $SiH_4$, $CHF_3$, and $CH_2F_2$ may be similarly used as a control gas instead of HBr. In an implementation, in the etching method using the RPS, according to the present embodiment, the control gas may include other various kinds of suitable gases that include hydrogen (H), in an implementation, in the etching method using the RPS, according to the present embodiment, $H_2O$ and $H_2$ may be excluded from the control gas.

Figure 8:
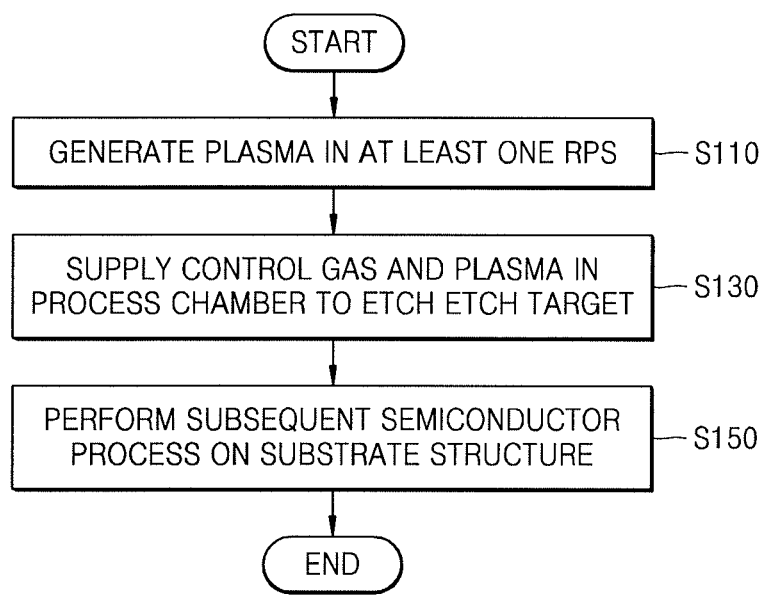
FIG. 8 illustrates a flowchart of a method of fabricating a semiconductor device including an etching method using the RPS, according to an embodiment.

FIG. 8 illustrates a flowchart of a method of fabricating a semiconductor device including an etching method using the RPS, according to an embodiment.

Referring to FIG. 8, in the semiconductor device manufacturing method according to the present embodiment, at first, plasma may be generated in at least one RPS (S110). The generation of plasma in at least one RPS is the same as described in the description of FIGS. 1 to 3B.

Then, a control gas and a plasma may be provided to a process chamber to etch an etch target (S130). In the etching of the etch target (S130), the control gas may include, e.g., HBr, HCl, HI, $NH_3$, $SiH_4$, $CHF_3$, or $CH_2F_2$. In an implementation, the control gas may include other various types of suitable gases that include hydrogen (H). In an implementation, $H_2O$ and $H_2$ may be excluded from the control gas. The method of supplying the control gas with the plasma to a process chamber is the same as described in the description of FIG. 2.

Here, the etch target may be a substrate or a material film on the substrate. For example, the etch target may be a material film containing SiNx, $SiO_2$, or the like on a substrate. In the method of fabricating a semiconductor device according to the present embodiment, the etch target may be a material film containing SiNx, and a non-etch target may be a material film including $SiO_2$.

Subsequently, a semiconductor process may be performed on a substrate structure (S150). Here, the substrate structure may include a substrate and a material film on the substrate. In an implementation, the substrate structure may be the result obtained after the material film of the etch target is removed. The subsequent semiconductor process may include various processes. For example, the subsequent semiconductor process may include a deposition process, an etching process, an ion process, a cleaning process, and the like. Here, the deposition process may include various material-layer-formation processes such as chemical vapor deposition (CVD), sputtering, and spin coating. The etching process may be an etching process using plasma as described above, or an etching process performed without plasma. The ion process may include a process such as ion implantation, diffusion, and heat treatment. By performing the subsequent semiconductor process, integrated circuits and interconnections for a semiconductor device may be formed.

In an implementation, the subsequent semiconductor process may include a packaging process in which a semiconductor device is mounted on a printed circuit board (PCB) and sealed with a sealing material. In an implementation, the subsequent semiconductor process may include a test process in which a semiconductor device or a package is tested. By performing such subsequent semiconductor processes, fabrication of a semiconductor device or a semiconductor package may be completed.

By way of summation and review, in the case of an etching process using direct plasma, improvement of selectivity may be limited, and a film which does not require etching could be damaged.

The embodiments may provide a method of etching a material film containing SiNx with a high selectivity with respect to another material film and at a high etch rate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An etching method using a remote plasma source (RPS), the etching method comprising:
generating a plasma by supplying a process gas to two RPSs and applying power to the two RPSs; and
etching a first material film including SiNx by supplying the plasma and at least one control gas selected from HBr, HCl, HI, $NH_3$, $SiH_4$, $CHF_3$, and $CH_2F_2$ to a process chamber,
wherein the at least one control gas is supplied through:
one of the two RPSs,
the other of the two RPSs,
a passage between the process chamber and the one of the two RPSs,
a passage between the process chamber and the other of the two RPSs,
a shower head above the process chamber, or
an inlet directly connected to the process chamber.
2. The etching method as claimed in claim 1, wherein:
the process gas includes $NF_3$, and
the at least one control gas includes HBr.
3. The etching method as claimed in claim 2, wherein:
HBr is supplied in such a way that Equation 1 is satisfied,

$$[NF_3]/[HBr] \leq 1 \quad (1), \text{ and}$$

$[NF_3]$ and [HBr] represent a flow rate of $NF_3$ and a flow rate of HBr, respectively.
4. The etching method as claimed in claim 1, wherein:
the process gas includes $NF_3$, $N_2$, and $O_2$, and
the at least one control gas includes HBr.
5. The etching method as claimed in claim 4, wherein:
the two RPSs include a first RPS and a second RPS,
$NF_3$, $N_2$, $O_2$, and the at least one control gas are supplied to the first RPS, and
$N_2$, $O_2$, and the at least one control gas are supplied to the second RPS.
6. The etching method as claimed in claim 1, wherein the first material film is selectively etched with respect to a second material film containing $SiO_2$.
7. The etching method as claimed in claim 6, wherein:
an etch rate of the first material film is 200 Å/min or more, and
a selectivity of the first material film with respect to the second material film, calculated as follows: an etch rate of the first material film/an etch rate of the second material film, is 500 or more.
8. An etching method using a remote plasma source (RPS), the etching method comprising:
generating a first plasma by supplying a first process gas to a first RPS and applying first power thereto;
generating a second plasma by supplying a second process gas to a second RPS and applying second power thereto; and
etching a first material film including SiNx by supplying the first plasma, the second plasma, and at least one control gas selected from HBr, HCl, HI, $NH_3$, $SiH_4$, $CHF_3$, and $CH_2F_2$ to a process chamber.
9. The etching method as claimed in claim 8, wherein the at least one control gas is supplied through:
the first RPS,
the second RPS,
a passage between the first RPS and the process chamber,
a passage between the second RPS and the process chamber,
a shower head above the process chamber, or
an inlet directly connected to the process chamber.
10. The etching method as claimed in claim 8, wherein:
the first process gas and the second process gas include $NF_3$,
the at least one control gas includes HBr,
HBr is supplied in such a way that Equation 1 is satisfied, $$[NF_3]/[HBr] \leq 1 \quad (1), \text{ and}$$

$[NF_3]$ and [HBr] represent a flow rate of $NF_3$ and a flow rate of HBr, respectively.
11. The etching method as claimed in claim 8, wherein:
the first process gas and the second process gas include $NF_3$, $N_2$, and $O_2$, and
the at least one control gas includes HBr.
12. The etching method as claimed in claim 11, wherein:
$NF_3$, $N_2$, $O_2$, and the at least one control gas are supplied to the first RPS, and
$N_2$, $O_2$, and the at least one control gas are supplied to the second RPS.
13. The etching method as claimed in claim 11, wherein the first material film is selectively etched with a selectivity of 500 or more with respect to a second material film containing $SiO_2$ and at an etch rate of 200 Å/min or more.
14. A method of fabricating a semiconductor device, the method comprising:

generating a plasma by supplying process gases to a first remote plasma source (RPS) and a second RPS and applying power thereto;

etching a first material film containing SiNx and constituting a substrate structure by supplying the plasma and at least one control gas selected from HBr, HCl, HI, NH$_3$, SiH$_4$, CHF$_3$, and CH$_2$F$_2$ to a process chamber; and performing a subsequent semiconductor process on the substrate structure, wherein the at least one control gas is supplied through:
the first RPS,
the second RPS,
a passage between the process chamber and the first RPS,
a passage between the process chamber and the second RPS,
a shower head above the process chamber, or
an inlet directly connected to the process chamber.

15. The method as claimed in claim 14, wherein:
the process gases include NF$_3$,
the at least one control gas includes HBr,
HBr is supplied in such a way that Equation 1 is satisfied, $$[NF_3]/[HBr] \leq 1 \qquad (1), \text{ and}$$

[NF$_3$] and [HBr] represent a flow rate of NF$_3$ and a flow rate of HBr, respectively.

16. The method as claimed in claim 14, wherein:
NF$_3$, N$_2$, O$_2$, and the at least one control gas are supplied to the first RPS, and
N$_2$, O$_2$, and the at least one control gas are supplied to the second RPS.

17. The method as claimed in claim 14, wherein in the etching, the first material film is selectively etched with a selectivity of 500 or more with respect to a second material film containing SiO$_2$.

* * * * *